United States Patent
Bradley

(10) Patent No.: US 7,509,107 B2
(45) Date of Patent: Mar. 24, 2009

(54) METHOD AND APPARATUS FOR EXTENDING THE LOWER FREQUENCY OPERATION OF A SAMPLER BASED VNA

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 834 days.

(21) Appl. No.: 11/029,557

(22) Filed: Jan. 5, 2005

(65) Prior Publication Data
US 2006/0148472 A1 Jul. 6, 2006

(51) Int. Cl.
*H03K 5/01* (2006.01)

(52) U.S. Cl. .................. 455/258; 327/119; 327/166; 342/82

(58) Field of Classification Search ............... 324/76.11, 324/76.15, 76.19, 76.24, 76.58, 76.77, 601, 324/650, 82–87, 98; 455/190.1, 258, 323, 455/334, 42, 118, 205, 256; 327/113, 115, 327/116, 117, 119, 164, 166, 172–175, 189
See application file for complete search history.

(56) References Cited

U.S. PATENT DOCUMENTS

| | | | | |
|---|---|---|---|---|
| 4,048,567 A | * | 9/1977 | Johnson et al. | .......... 455/226.1 |
| 5,523,760 A | * | 6/1996 | McEwan | ................. 342/89 |
| 5,524,281 A | | 6/1996 | Bradley | |
| 5,647,039 A | * | 7/1997 | Judkins et al. | ................. 385/37 |
| 6,614,214 B2 | * | 9/2003 | Mizuhara et al. | .......... 324/76.15 |
| 6,650,101 B2 | * | 11/2003 | MacDonald et al. | ...... 324/76.24 |
| 7,088,111 B2 | * | 8/2006 | Noujeim | ..................... 324/650 |
| 2005/0140542 A1 | * | 6/2005 | Ikeda | .......................... 342/118 |

* cited by examiner

*Primary Examiner*—Blane J Jackson
(74) *Attorney, Agent, or Firm*—Fliesler Meyer LLP

(57) ABSTRACT

Circuitry is provided to drive a step recovery diode (SRD) (8) in a sampler based vector network analyzer (VNA) that allows harmonic samplers (10, 11) to operate over many octaves. The circuit includes a digital pulse generator (FIG. 5) for providing a LO signal. The LO signal is provided over an octave frequency range as in previous SRD driver circuits, but pulse forming circuitry is provided to decrease the pulse rate to a sub multiple of the LO generating oscillator signal. The pulse forming circuitry includes a programmable frequency divider (50) to vary the pulse rate. The pulse forming network further includes registers (50, 52) connected to the programmable frequency divider (50) to limit the pulse width resulting in reduced heating of the SRDs. With an effectively wider frequency operation range using the SRD (8), only one down-conversion is required in the VNA, eliminating the need for additional mixers (30, 31) and a second LO signal generator (24) to provide a second downconversion.

15 Claims, 5 Drawing Sheets

| $F_{RF}$ (MHz) | $F_{LO1}$ (MHz) | H | $F_{IF1}$ (KHz) |
|---|---|---|---|
| 25-50 | 25.2 - 50.2 | 1 | 200 |
| 50-100 | 25.1 - 50.1 | 2 | 200 |
| 100-150 | 33.4 - 50.07 | 3 | 200 |
| 150-200 | 37.55 - 50.05 | 4 | 200 |
| 200-250 | 40.04 - 50.04 | 5 | 200 |
| 950-1000 | 47.50 - 50.01 | 20 | 200 |
| 1950-2000 | 48.76 - 50.00 | 40 | 200 |
| 2950-3000 | 49.17 - 50.00 | 60 | 200 |
| 3950-4000 | 49.38 - 50.00 | 80 | 200 |

| LO (MHz) | N | $F_{LO}$ (MHz) | Tpulse (nS) |
|---|---|---|---|
| 50-100 | 2 | 25 - 50 | 20 - 10 |
| 50-100 | 4 | 12.5 - 25 | 20 - 10 |
| 50-100 | 8 | 6.25 - 12.5 | 20 - 10 |
| 50-100 | 16 | 3.125 - 6.25 | 20 - 10 |
| 50-100 | 32 | 1.56 - 3.125 | 20 - 10 |
| 50-100 | 64 | .781 - 1.56 | 20 - 10 |
| 50-100 | 128 | .390 - .781 | 20 - 10 |

METHOD AND APPARATUS FOR EXTENDING THE LOWER FREQUENCY OPERATION OF A SAMPLER BASED VNA

BACKGROUND

1. Technical Field

The present invention relates to components for generating a signal to drive a step recovery diode (SRD) of a sampler based vector network analyzer (VNA).

2. Related Art

To generate and downconvert high frequency RF signals in a VNA, harmonic samplers are used with higher order harmonics selected for downconversion by an appropriate LO signal when high frequency signals are desired. To generate high frequency LO signals to apply to the harmonic samplers for downconverting the higher order harmonics, a step recovery diode (SRD) is used to generate LO pulses with sufficient power and frequency for the downconversion.

A conventional VNA uses a multiple step downconversion process for high frequencies. A first downconversion is performed with harmonic samplers and a high frequency LO signal. A second downconversion is then performed to further reduce frequency to a baseband using a mixer and a low frequency LO signal.

In such a conventional sampler VNA system with two downconversions, when measurement frequencies drop below the high frequency harmonic sampler LO frequency range, the sampler SRDs are forward biased, effectively disabling the first LO, so that the sampler output is passed directly to the mixers in the second downconversion process. This pass through process is termed a "Direct Mode." In the direct mode, the mixers in the second downconverter function alone to downconvert the passed through measurement frequency to base band for signal processing. The harmonic samplers and higher frequency LO with all its associated phase locking circuitry is not used in the direct mode. Not only is the first downconversion circuitry not used in direct mode, but also using the direct mode requires the second down conversion to provide the downconversion to base band at higher frequencies. Such a sampler based VNA configuration is described in U.S. Pat. No. 5,524,281 (hereinafter the '281 patent) entitled "Apparatus and Method For Measuring The Phase And Magnitude Of Microwave Signals" and is used in the Wiltron 360 and the Anritsu Lightning line of instruments manufactured by Anritsu Company of Morgan Hill Calif. In particular, see FIG. 2B of the '281 patent with harmonic sampler 174 receiving a LO from harmonic generator 170 providing the first downconversion, and mixer 178 providing a second downconversion with selectable bypasses provided around harmonic samplers 174 for the direct mode. The SRDs 240 for generating the LO in harmonic generator 170 are shown in FIG. 5 of the '281 patent.

FIG. 1 herein illustrates components of a sampler based VNA providing for a first downconversion, a second downconversion and a direct mode as described in the '281 patent. In the VNA, an RF signal, $F_{RF}$, is provided from signal source 2 and split into two signal portions by power splitter 4. The incident signal is provided to a harmonic sampler 10, while the reflected test signal is provided from coupler 6 to harmonic sampler 11. A SRD 8 provides the LO signal, $F_{LO1}$, to second inputs of harmonic sampler 10 and 11. The SRD 8 is driven by a LO signal from oscillator 14 through a power amplifier 16 and Pulse Forming Network (PFN) 18. The SRD 8 functions by charging up during a first portion of a clock cycle from LO signal oscillator 14, and then discharging to provide a high voltage pulse that drives the harmonic sampler 10 during a second short portion of the clock period. The output of the harmonic samplers 10 and 11 provide an IF signal, $F_{IF1}$, that includes multiple harmonics of the $F_{RF}$ signal. One of the harmonics, H, is selected depending on the frequency for the IF signal desired and the rest are filtered out by filters 20 and 21. The outputs of filters 20 and 21 are provided through mixers 30 and 31 to provide the second downconversion to a baseband signal for processing. The second LO signal is provided by oscillator 24. Bypass switches 40 and 41 are used to bypass harmonic samplers 10 and 11 if a direct mode is desired.

The design of a sampler based VNA shown in FIG. 1 relies on the under sampling technique to allow high frequency operation. The relationship of the RF, LO and IF frequencies is described as $F_{IF1}=ABS(F_{RF}-H*F_{LO1})$. In practice the harmonic H selected from the harmonic samplers 10 and 11 used to create the signal $F_{IF1}$ is kept as low as possible to reduce the noise multiplying effect of the $F_{LO1}$ signal.

A key to high frequency operation of the harmonic samplers 10 and 11 is the width of the pulse, $t_{samp}$, used to turn on the internal sampling diodes of the harmonic samplers 10 and 11. The first null in the frequency response to $F_{RF}$ occurs at $1/t_{samp}$. To maintain a narrow $t_{samp}$, and thus limit any null, the SRD 8 is used. The SRD 8 in turn is driven by a high power amplifier 16 followed by the complex PFN 18.

An example of frequencies used in the system of FIG. 1 is shown in FIG. 2 with a test signal $F_{RF}$ from RF source 2 ranging from 25 MHz to 4 GHz. FIG. 2 shows the relationship for various harmonics H from the harmonic sampler. The PFN 18 is optimized at the highest $F_{LO1}$ frequency. Degradation of the pulse is allowed at $F_{LO1}$ below the optimized PFN frequency because the harmonic samplers are more efficient at lower harmonic numbers. The $F_{LO1}$ range is limited to an octave or 2:1 ratio at the lowest frequency, due to the narrow band nature of the PFN. This octave span of $F_{LO1}$ is pushing the lower limit. As a reference point high end, conventional VNAs can cover a 1.5 to 1 ratio, such as the Wiltron 360 which covers a range from 357 to 536.5 MHz.

It is instructive to understand how the SRD 8 operates and why the PRN 18 has a lower frequency limit. The SRD 8 stores energy in its forward conduction cycle over a period of (t store), that is the minority carrier lifetime. It releases its charge when reverse biased. The SRD 8 acts as a normal diode except for a very short time after the drive polarity is reversed. The SRD 8 will maintain a charge in the forward biased direction when the reverse bias is applied. This short duration causes current to flow in the reverse direction. This time is called the delay time. When all of the carriers have been removed, the current drops abruptly to zero. At the end of this delay when the current goes from 80% to 20%, the pulse is created. The transition time of this pulse is on the order of 60 to 360 pS. The current needed to charge the SRD is on the order of 100 mA for 10 nS. This implies an impedance of 0.7V/100 mA or 7 Ohms. When the SRD is reverse biased the impedance goes to an open circuit. Driving the SRD with longer duration pulses does nothing other than heat up the diode, as all the minority carriers have been filled. This is the primary reason for limiting the lower $F_{LO1}$ drive frequency to an octave.

The PRN 18 for a harmonic H=1 must operate over a range of 25 to 50 MHz while providing 100 mA for at least half of the LO signal period from oscillator 14. The load it will drive will be 7 Ohms in one polarity and open circuit in the other polarity. The PRN 18 must also provide a high impedance to the pulse driving the harmonic samplers 10 and 11 while maintaining a low impedance to the power amplifier 16 driving the SRD 8. These seemingly contradictory requirements are met eloquently with the circuit shown in FIG. 3. For convenience, components carried over from FIG. 1 to FIG. 3 are similarly labeled, as will be components carried over in subsequent figures.

In operation with the circuitry of FIG. 3, the power amplifier 16 presents a low impedance moderate voltage level drive to the PFN 18. The PRN 18 transforms this to an even lower impedance using inductor 42 and capacitor 44 to match the 7 Ohm desired impedance of the SRD 8. The inductor 32 and resistor 34 provide a return path for the DC bias developed by the diode action of conduction to open circuit. The capacitor 40 provides DC blocking to prevent a path for the DC signal developed by power amplifier 16 to return to ground through inductor 32 and resistor 34. The inductance 36 between the PFN 18 and the SRD 8 provides for isolation of the PFN 18 from the pulse generated by the SRD 8. The isolation provided by inductor 36 allows the pulse from SRD 8 to have substantially all its energy applied to the harmonic samplers 10 and 11 through the capacitor 38. This capacitor 38 is used to allow the pulse from the SRD 8 to pass through to the harmonic samplers while attenuating the pulsed LO signal and providing DC blocking.

An ideal driver for the SRD 8, as opposed to the power amplifier 8 and PRN 18 of FIG. 3, would have a fixed pulse width 100 mA drive with a small inductor at its output to isolate the pulse from dissipating back into the LO pulse source. The pulse would have a constant width independent of the $F_{LO1}$ drive frequency. While this is ideal, the nature of pulse generators is such that the pulse duration is derived in some analog fashion. The pulse width, thus, invariably has noise associated with it that gets directly translated by H the harmonic number. The noise will cause deviations in the pulse rate of pulses generated by the SRD.

It would be desirable to provide a sampler based VNA that provides limited noise signals to a SRD over a wider frequency band, allowing use of only a single down conversion to eliminate the need for mixers 30 and 31, and LO oscillator 34, as well as switches 40 and 41 used in the direct mode.

SUMMARY

In accordance with the present invention, circuitry is provided that allows a sampler to operate many octaves below its previously designed lowest frequency. With a wider frequency operation range using the SRD, only one downconversion is required, eliminating the need for mixers and a second LO signal generator, as well as switches to bypass the harmonic samplers in a "direct mode."

The circuitry to drive the SRD according to the present invention uses a digital pulse generator to provide LO drive pulses with limited noise. The fact that the LO frequency source oscillator has a limit of an octave range can still be met, but pulse rate is controlled by pulse forming circuitry including a variable digital frequency divider. Pulse width is further controlled by registers connected to the frequency divider so that long pulse widths do not unnecessarily heat the SRDs. The pulse rate can be adjusted to any sub multiple of the LO generating oscillator signal frequency down to approximately 3 times the signal $F_{IF}$ using the variable frequency divider. The Nyquist rate would be 2 times $F_{IF}$, but aliasing in the form of spurious IF responses would corrupt the harmonic sampler output below this 3 times rate. The increased range of pulse rates enables a single LO signal to downconvert a much wider range of RF signals to IF with a single downconversion than previous circuits that use an analog drive circuit for the SRD.

BRIEF DESCRIPTION OF THE DRAWINGS

Further details of the present invention are explained with the help of the attached drawings in which.

DETAILED DESCRIPTION

Figure 1:
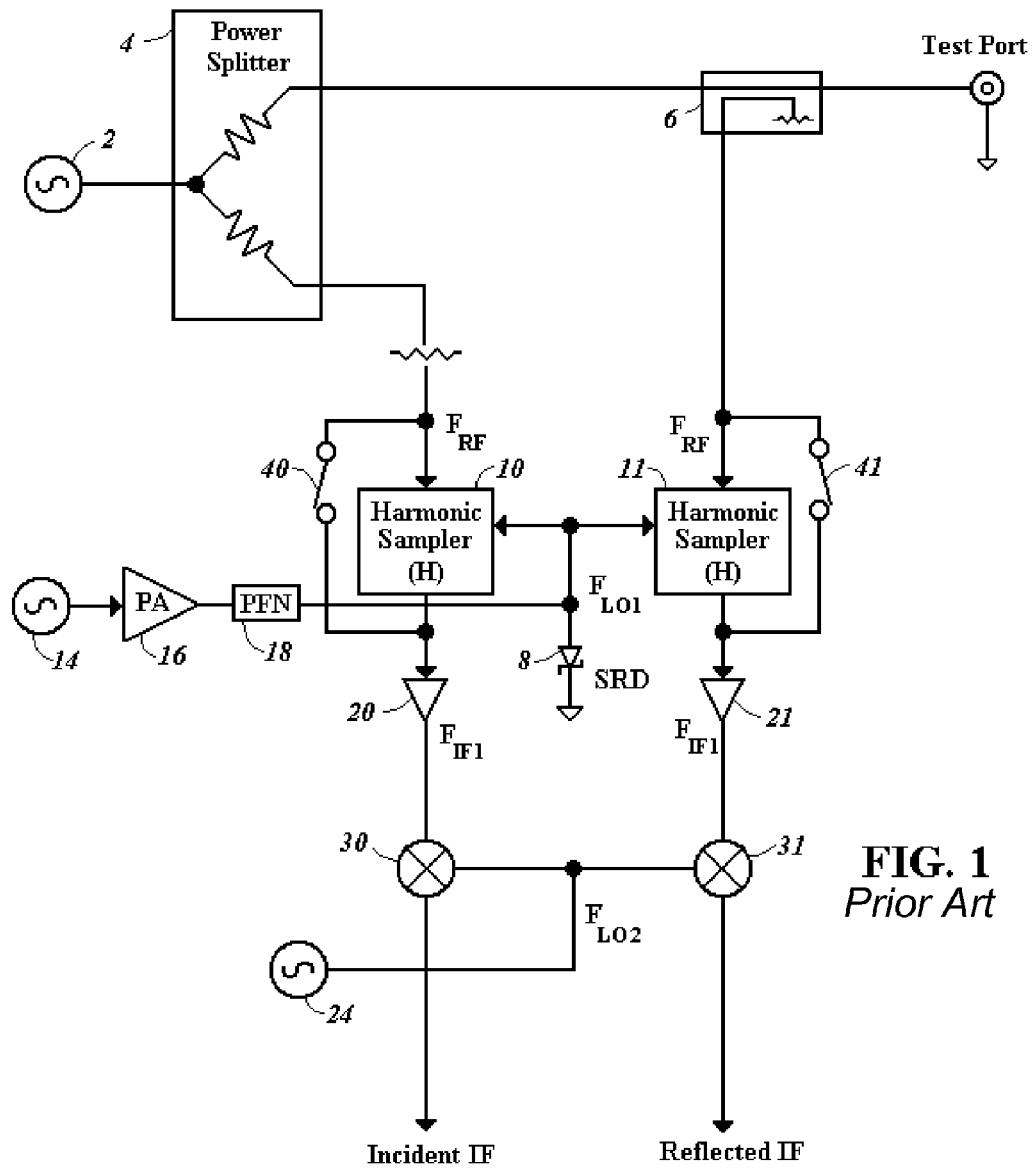
FIG. 1 shows a block diagram of components of a conventional sampler based VNA.
Figure 4:
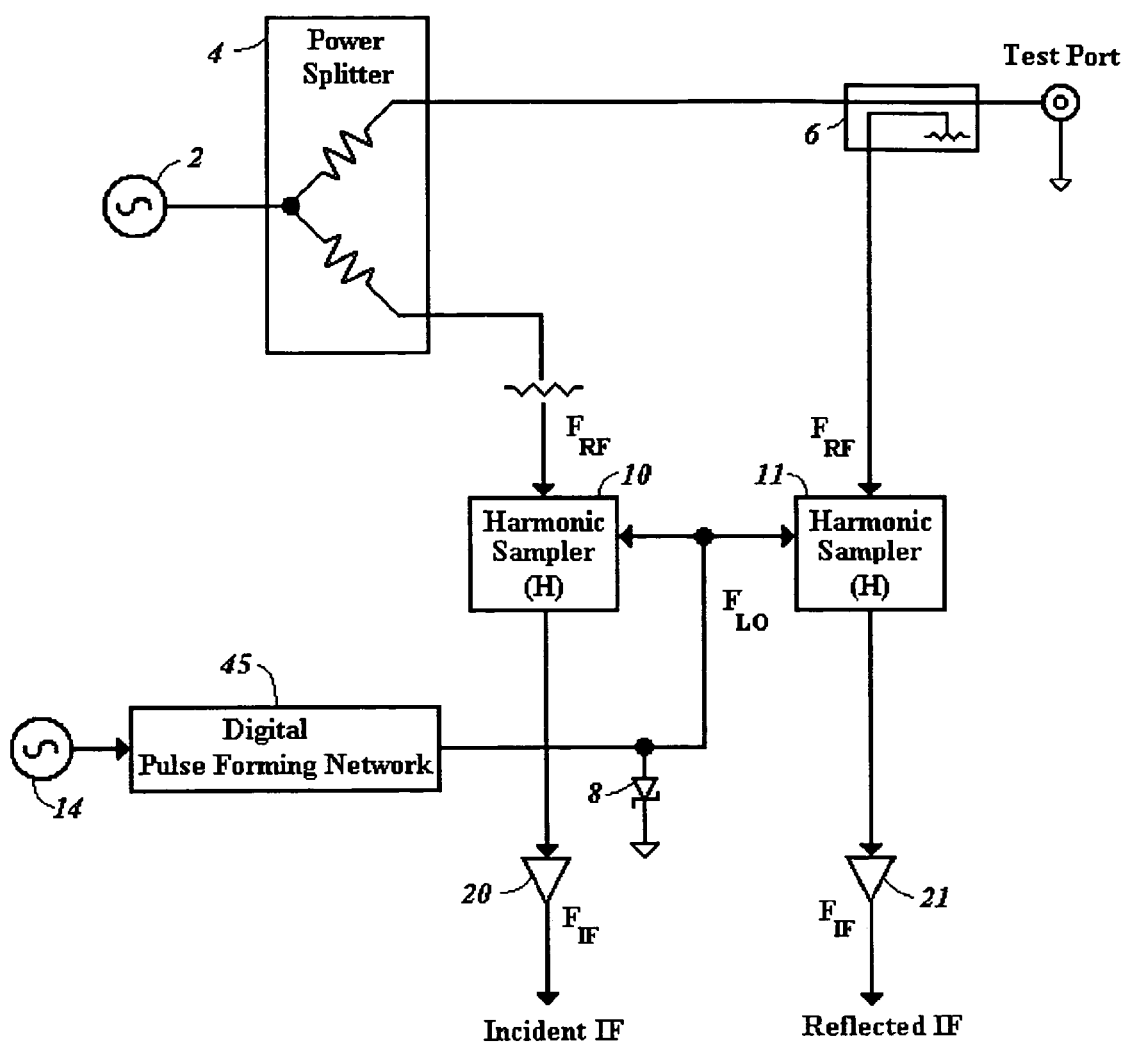
FIG. 4 shows modifications to the circuitry of FIG. 1 to include a digital pulse forming network for providing signals to the SRD in accordance with the present invention.

FIG. 4 shows modifications to the circuitry of FIG. 1 to include a digital pulse forming network 45 for providing signals to the SRD 8 in accordance with the present invention. The digital pulse forming network 45 having circuitry described to follow allows a low noise LO pulse to be provided to the SRD 8 over a wider frequency range than by using the amplifier 16 and PRN 18 of FIG. 1, that are removed. With the wider range of LO signals, the additional circuitry for a second down conversion is further eliminated from FIG. 4, including the mixers 30 and 32 and LO source 24. The bypass switches 40 and 41 to provide a direct mode are further eliminated in FIG. 4 since only one downconversion is used for all RF frequencies.

Figure 5:
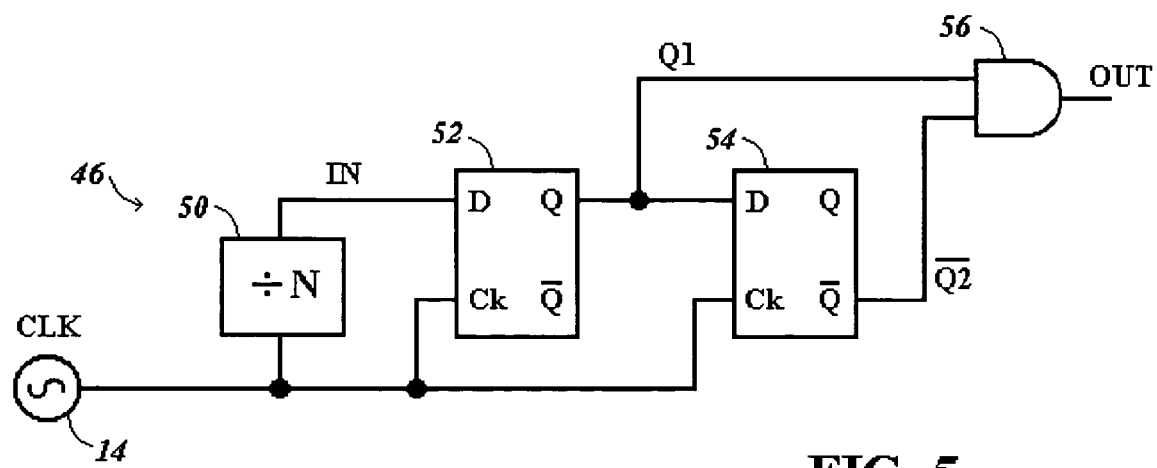
FIG. 5 shows one embodiment of circuitry for a digital pulse generator in FIG. 4.

FIG. 5 shows a digital pulse generator circuitry 46 for use in the digital pulse forming network 45 of FIG. 4. The digital pulse generator 46 includes a programmable divide by N frequency divider 50 along with registers 52 and 54 all connected to receive the LO oscillator signal 14. The output of oscillator 14 is provided to the input of frequency divider 50 so that the output of frequency divider 50 creates sub-multiples of the frequency of oscillator 14. The frequency division number N can be any integer selected from 2 to $F_{CLK}$ (low)/4*$F_{IF}$, where $F_{CLK}$(low) is the lowest frequency of the clock signal (CLK) from the LO oscillator 14. The oscillator 14 is further provided to the clock inputs of flip-flop registers 52 and 54. The register 52 has a data (D) input connected to the output of frequency divider 50, and non-inverting output (Q) connected to the D input of flip flop 54. The non-inverting input of register 52 is provided as a first input of AND gate 56, while the inverting output of register 54 is provided as a second input of AND gate 56. The output of AND gate 56 is provided as the output of the digital pulse generator 46. Although specific logic is shown in FIG. 5 to perform a given function, it is understood that changes in the components, such as the type of flip-flop registers 52 and 54 or substituting a different logic element for the AND gate can provide alternative design embodiments within the scope of the present invention.

Figure 6:
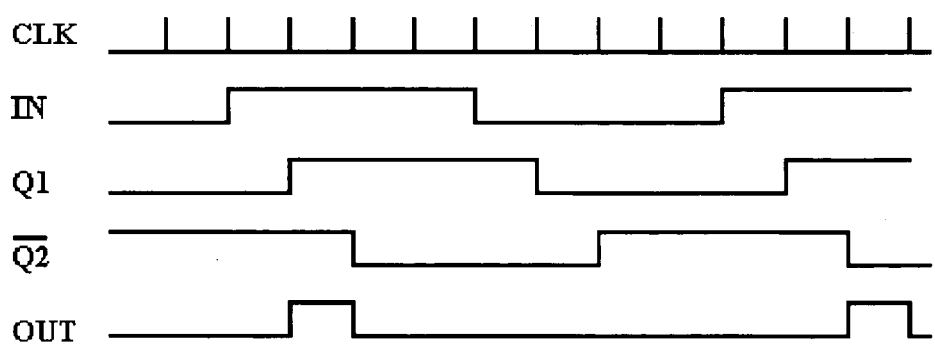
FIG. 6 shows a timing diagram for signals from the circuitry of FIG. 5.

Operation of the circuitry of FIG. 5 is described with respect to the timing diagram shown in FIG. 6. Initially, the clock signal, CLK, is shown provided from the LO signal source 14 as a series of marks indicating clock low to high transitions. The input (IN) to the register 52 as provided from the divide by N frequency divider 56 is next shown, with being set to N=8 so that a low to high transition occurs in the signal IN every eight cycles of the clock signal CLK. The non-inverting output (Q1) from register 52 then provides a low to high transition every eight clock cycles, the transitions occurring one clock cycle after the transition of IN. The inverting output (Q2) from register 54 then provides a high to low transition every eight clock cycles, the high to low transitions occurring one clock cycle after the low to high transition of Q1. The output of the AND gate 56, then transitions between the non inverting Q1 low to high and the inverting high to low Q2 transitions, providing one pulse every eight clock periods. The pulse width of OUT remains at one clock cycle, irrespective of the division number N chosen, preventing overheating of the SRD, while allowing a lower frequency OUT signal to drive the SRD.

Figures 2, 3:
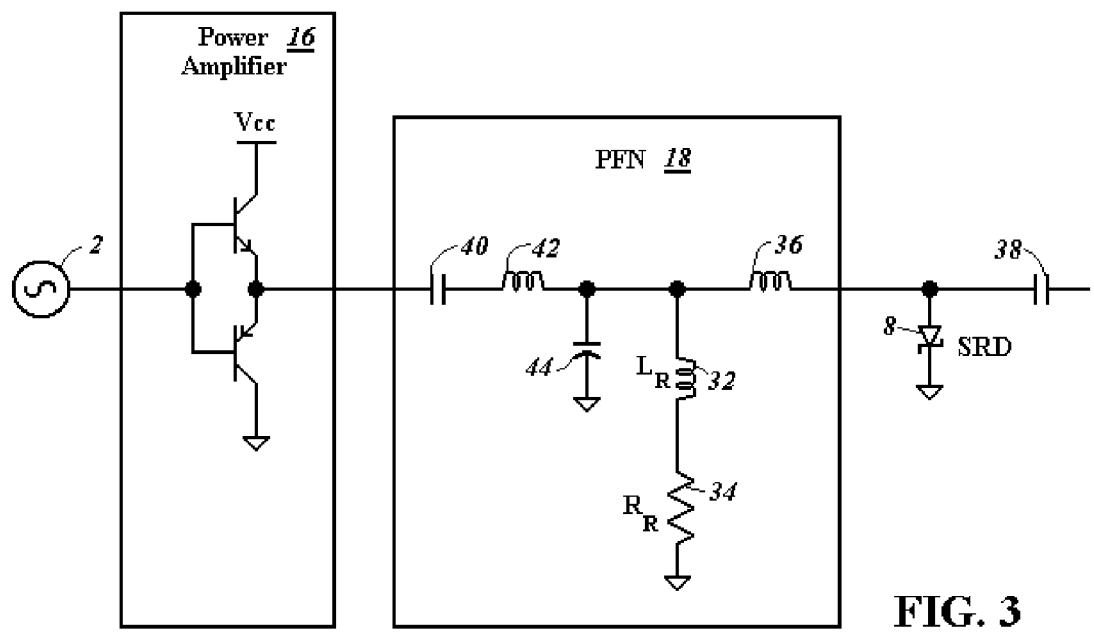
FIG. 2 provides a table showing RF frequencies ranging from 25 MHz to 4 GHz with LO frequencies set for particular harmonic levels H to provide a 200 KHz IF frequency in a conventional sampler based VNA.
FIG. 3 shows more details of conventional components used to drive a step recovery diode (SRD)

With the signal (OUT) providing a one clock (CLK) cycle pulse, irrespective of the number N chosen, the circuit of FIG. 5 will produce an output (OUT) having a pulse period of 1/CLK. With a clock signal (CLK) derived from the LO oscillator 16, then the oscillator 16 will need to operate at two times the desired output frequency to provide a desired pulse width with respect to the PRN circuit of FIG. 3. With the PFN circuit shown in FIG. 3, the LO operated from 25 to 50 MHz, as shown in FIG. 2, corresponds to a square wave with a positive pulse width varying from 20 to 10 nS. In the example of FIG. 5, the CLK would operate at 50 to 100 MHz to get the same positive pulse width.

Figures 7, 8:
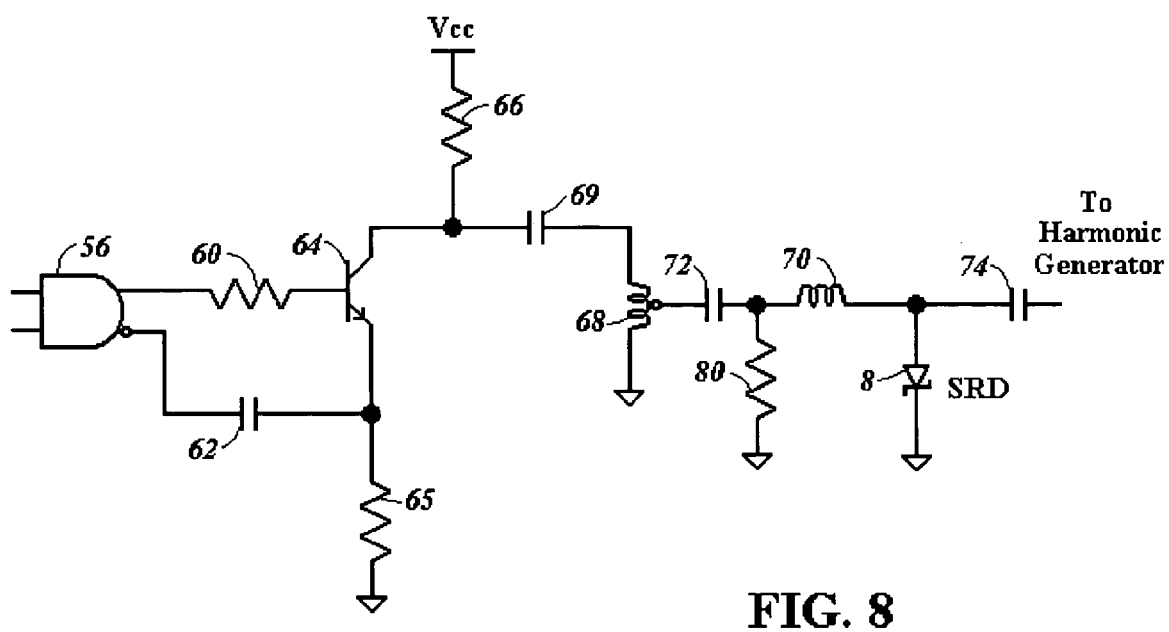
FIG. 7 provides a table showing $F_{LO}$ frequencies with a LO oscillator ranging from 50-100 MHz using different frequency divider numbers N for the circuitry of FIG. 5.
FIG. 8 shows an embodiment of additional circuitry for the digital pulse forming network of FIG. 4 used to drive the SRD for a harmonic sampler.

FIG. 7 lists example values for the LO oscillator, N, and $T_{pulse}$ for various $F_{LO}$ frequencies for the circuitry of FIG. 5. The examples of FIG. 7 show operation with the $F_{LO}$ frequency of 6.25 to 12.5 MHz with N=8 providing a desired pulse width from 20 to 10 nS. The divide by 8 number N can be replaced with any integer divider from 2 to $F_{CLK}$(low)/$4*F_{IF}$ while retaining the 20 to 10 nS pulse width, as further illustrated in FIG. 7 as long as the LO frequency remains from 50-100 MHz.

In a preferred embodiment, a 1250 to 2500 MHz oscillator is used as the main LO source oscillator 16. The oscillator 16 output is then provided through a divide by 16 divider to further reduce its noise by as much as 24 dB. The output frequency of this divider being 78.125 to 156.25 MHz then drives the programmable frequency divider 50 which can divide by a number N between 2 and 256. The divide number N of either 2, 4, 8, 16, 32, 64, 128 and 256, all being powers of 2, are preferred to allow a continuous $F_{LO}$ frequency range of 301 KHz to 78.125 MHz with a pulse width that varies from 12.8 to 6.4 nS. The higher frequency of 78.125 MHz vs. the old highest frequency of 50 MHz from components of FIG. 3, as shown in FIG. 2, is needed to allow operation up to 8 GHz where the maximum H from the harmonic samplers is dropped from a value of 160 (8 GHz/50 MHz) down to 102 (8 GHz/78.125 MHz). Lowering the value of H reduces the noise caused by multiplying by H. The programmable frequency divider 50 in this example embodiment has the desired pulse width available at its output without the need for the additional pulse converter circuit elements 52, 54 and 56 depicted in FIG. 5. This is a byproduct of the particular programmable frequency divider 50 used, for example in one embodiment the Model MC100EP016 Synchronous Binary Up Counter available from Semiconductor Components Industries LLC may be used.

FIG. 8 shows an embodiment of additional circuitry for the digital pulse forming network 46 of FIG. 4 needed in addition to the circuitry of FIG. 5 to drive the SRD for a harmonic sampler. The circuit includes the AND gate 56 from the circuit of FIG. 5. The output of AND gate 56 is provided to an amplifier made up of components including a BJT transistor 64. Biasing for the transistor 64 includes a current source formed by resistor 66 connecting the collector of transistor 64 to Vcc. Biasing is further provided by a current sink 65 connecting the emitter of transistor 64 to ground. Biasing also includes a resistor 60 connecting the noninverting output from AND gate 56 to the base of transistor 64. A capacitor 62 connects the inverting output of AND gate 56 to the emitter of transistor 64 used to speed up the fall time of the collector voltage waveform across resistor 66. The collector of transistor 64 provides the amplifier output to a transformer 68 that drives the SRD 8. The SRD 8 provides a pulse that is blocked from the transformer 68 from by inductor 70. A DC offset from the SRD 8 is blocked from the transformer 68 and harmonic samplers by the capacitors 72 and 74. A resistor 80 is provided for DC return of offset generated by the SRD 8. A capacitor 69 further serves to block any DC offset between the transformer 68 and the amplifier. Although the circuitry of FIG. 8 provides one implementation for amplifying a digital signal generated to the SRD, it is understood that other amplification circuits may be used depending on design requirements.

As an alternative to a common configuration for a VNA reflectometer shown in FIG. 1, harmonic samplers can be used in other receiver environments that employ an SRD driven by a digital signal generating drive circuit according to the present invention. For example, the VNA of FIG. 1 can be used with a direct link from the test port to a harmonic sampler during transmission measurements, instead of through coupler 6. Further, a single harmonic sampler in a receiver might be used that is driven by an SRD with a digital signal drive circuit.

Although the present invention has been described above with particularity, this was merely to teach one of ordinary skill in the art how to make and use the invention. Many additional modifications will fall within the scope of the invention, as that scope is defined by the following claims.

What is claimed is:

1. A pulse forming network for providing a signal to a step recovery diode, the pulse forming network comprising:
    a clock signal generator;
    a programmable frequency divider having an input connected to the clock signal generator and having an output; and
    means for providing digital pulses to the step recovery diode, the means for providing digital pulses receiving the output of the programmable frequency divider and providing the digital pulses with a frequency set by a frequency division value of the programmable frequency divider, wherein the digital pulses have a common pulse width independent of the frequency division value of the programmable frequency divider.

2. A pulse forming network for providing a signal to a step recovery diode, the pulse forming network comprising:
    a programmable frequency divider;
    a first flip flop having an input connected to an output of the programmable frequency divider;
    a second flip flop having an input connected to an output of the first flip flop; and a logic gate having a first input connected to the output of the first flip flop, a second input connected to an output of the second flip flop and having an output connected to the step recovery diode, wherein spacing between digital pulses provided at the step recovery diode is controlled by a frequency division value programmed into the programmable frequency divider.

3. The pulse forming network of claim 2, wherein the first flip flop, the second flip flop and the programmable frequency divider have an input for receiving a common clock signal.

4. The pulse forming network of claim 3, wherein the logic gate comprises an AND gate that receives a non-complement data output from the first flip-flop and a complement data output from the second flip-flop.

5. The pulse forming network of claim 2 further comprising:
an inductor connecting the output of the logic gate to the step recovery diode with a value set to substantially block pulses generated by the step recovery diode.

6. The pulse forming network of claim 2 further comprising:
a transistor amplifier having an input driven by the output of the logic gate; and
a transformer having a primary winding connected to the transistor amplifier and a secondary winding connected to the step recovery diode.

7. The pulse forming network of claim 6, further comprising:
an inductor connecting the secondary winding of the transformer to the step recovery diode with a value set to substantially block pulses generated by the step recovery diode.

8. The pulse forming network of claim 2, wherein the first flip-flop, the second flip-flop, and the logic gate form a pulse converter circuit that provides a common pulse width irrespective of the frequency division programmed into the programmable frequency divider.

9. A reflectometer for a VNA comprising:
a first harmonic sampler having a first input receiving an incident RF test signal and a second input for receiving a LO signal;
a second harmonic sampler having a first input receiving a reflected RF test signal and a second input for receiving the LO signal;
a step recovery diode connected to the second input of the first harmonic sampler and the second harmonic sampler; and
a digital signal pulse generator circuit connected to the step recovery diode, wherein the digital signal pulse generator circuit comprises:
a programmable frequency divider;
a first flip flop having an input connected to an output of the programmable frequency divider;
a second flip flop having an input connected to an output of the first flip flop; and
a logic gate having a first input connected to the output of the first flip flop, a second input connected to an output of the second flip flop and having an output connected to the step recovery diode.

10. The reflectometer of claim 9 further comprising:
an inductor connecting the output of the logic gate to the step recovery diode with a value set to substantially block pulses generated by the step recovery diode.

11. A method for driving a step recovery diode (SRD) comprising:
generating a digital pulse signal from a clock signal wherein a pulse width of the digital pulse signal is a single cycle of the clock signal,
setting a pulse frequency between pulses of the digital pulse signal by varying a number of cycles of the clock signal between the pulses; and
applying the digital pulse signal to the SRD.

12. A method for driving a step recovery diode (SRD) comprising:
generating a digital pulse signal from a clock signal wherein a pulse width of the digital pulse signal is a common number of cycles of the clock signal;
setting a pulse frequency between pulses of the digital pulse signal by varying a number of cycles of the clock signal between the pulses, wherein the pulses have a common pulse width independent of the setting of the pulse frequency; and
applying the digital pulse signal to the SRD.

13. The method of claim 12, wherein the pulse frequency is selectable over an octave range of frequencies.

14. A pulse forming network for providing a signal to a step recovery diode, the pulse forming network comprising:
a clock signal generator;
a programmable frequency divider having an input connected to the clock signal generator and providing an output; and
logic connected to the output of the programmable frequency divider and the clock signal generator, the logic providing digital pulses to the step recovery diode with a frequency of the pulses determined by a frequency division value of the programmable frequency divider, and wherein the logic is configured to cause the digital pulses to have a common pulse width independent of the frequency division value of the programmable frequency divider.

15. The method of claim 14, wherein the pulse frequency is selectable over an octave range of frequencies.

* * * * *